(12) United States Patent
Seo et al.

(10) Patent No.: US 9,571,106 B2
(45) Date of Patent: Feb. 14, 2017

(54) DELAY LOCKED LOOP CIRCUIT

(71) Applicant: SK hynix Inc., Gyeonggi-do (KR)

(72) Inventors: Young-Suk Seo, Gyeonggi-do (KR); Da-In Im, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/710,326

(22) Filed: May 12, 2015

(65) Prior Publication Data

US 2016/0182063 A1 Jun. 23, 2016

(30) Foreign Application Priority Data

Dec. 19, 2014 (KR) ........................ 10-2014-0184289

(51) Int. Cl.
| | |
|---|---|
| *H03L 7/06* | (2006.01) |
| *H03L 7/081* | (2006.01) |
| *G11C 7/22* | (2006.01) |
| *H03L 7/16* | (2006.01) |

(52) U.S. Cl.
CPC ............... *H03L 7/0812* (2013.01); *G11C 7/22* (2013.01); *H03L 7/0814* (2013.01); *H03L 7/16* (2013.01); *G11C 7/222* (2013.01)

(58) Field of Classification Search
CPC ...................................................... H03L 7/0812
See application file for complete search history.

(56) References Cited

U.S. PATENT DOCUMENTS

| | | | | |
|---|---|---|---|---|
| 2006/0170471 A1* | 8/2006 | Haerle | .................. | H03L 7/0812 327/158 |
| 2014/0273904 A1* | 9/2014 | Liu | .......................... | H04B 1/16 455/257 |

FOREIGN PATENT DOCUMENTS

KR 1020110060741 6/2011

* cited by examiner

*Primary Examiner* — Daniel Puentes
(74) *Attorney, Agent, or Firm* — IP & T Group LLP

(57) ABSTRACT

A delay locked loop (DLL) circuit may include: a DLL unit suitable for generating an internal clock by delaying an external clock by a delay amount required for locking; a single-to-differential divider suitable for generating multi-phase divided clocks at a specific edge of the internal clock; and a phase correction unit suitable for correcting a phase error between the multi-phase divided clocks.

17 Claims, 5 Drawing Sheets

DELAY LOCKED LOOP CIRCUIT

CROSS-REFERENCE TO RELATED APPLICATIONS

The present application claims priority of Korean Patent Application No. 10-2014-0184289, filed on Dec. 19, 2014, which is incorporated herein by reference in its entirety.

BACKGROUND

1. Field

Various embodiments of the present invention relate to a semiconductor design technology, and more particularly, to a delayed locked loop (DLL) circuit for generating multi-phase divided clocks.

2. Description of the Related Art

In a semiconductor system (or circuit), a clock is used as a reference signal for adjusting operation timing, and is used to guarantee high-speed operation without errors.

When an externally inputted clock is used within a semiconductor system, clock skew corresponding to the time delay that is caused by an internal circuit of the semiconductor system may occur. When clock skew occurs, a delayed locked loop (DLL) is used to correct the time delay.

As the operating frequency of semiconductor memory devices increases, a multi-phase clock transmission method is employed to transmit the internal clock signal. In the multi-phase clock transmission method, a high-frequency clock is not transmitted as it is, but multiple internal clock signals having lower frequencies are used. For instance, the internal clocks signals having half the frequency of the external clock signal may be generated and transmitted in the semiconductor memory device. Using the multi-phase clock transmission method, the semiconductor memory device may reduce current consumption that is required for transmitting the internal clock, and secure a more stable timing margin for the internal clocks.

As the operating speed of a semiconductor memory device increases, the number of internal clock signals used for the multi-phase clock transmission method is also increased. To generate the internal clock signals, an analog-controlled DLL is generally used.

FIG. 1 is a diagram illustrating a conventional DLL circuit.

Referring to FIG. 1, the DLL circuit includes a dividing unit 110, a delay locked loop (DLL) unit 120, a splitter 130, and a phase correction unit 140.

The dividing unit 110 receives external differential clocks CLK and CLKB, and generates a first internal clock ICK/2 and a second internal clock QCK/2 by dividing the external differential clocks CLK and CLKB, the second internal clock QCK/2 having a phase difference from the first internal clock ICK/2.

The DLL unit 120 includes a delay line unit 121, a replica delay unit 122, a phase comparison unit 123, and a delay control unit 124.

The delay line unit 121 outputs first and second delay locked clocks CK and QCK by delaying the first and second internal clocks ICK/2 and QCK/2 in response to a first delay control signal CTRL1.

The replica delay unit 122 reflects an actual delay of a clock and data path into the first delayed clock CK outputted from the delay line unit 121, and outputs a feedback clock FBCLK. The feedback clock FBCLK is obtained by adding a delay amount of the delay line unit 121 and a delay amount of the replica delay unit 122 to the first internal delay clock ICK/2.

The phase comparison unit 123 compares a phase of the external clock CLK to a phase of the feedback clock FBCLK, and outputs the comparison result UP/DN.

The delay control unit 124 outputs the first delay control signal CTRL1 according to the comparison result of the phase comparison unit 123.

While repeating such a series of operations, the DLL circuit compares the first internal clock ICK/2 to the feedback clock FBCLK. When the two clocks have minimum jitter, they are locked to output the first delay locked clock CK having a desired phase. After locking is achieved an update operation for repeating the locking process is performed at each predetermined period. The update operation is performed to compensate for jitters of the first and second delay locked clocks CK and QCK, which may occur due to noise after locking is achieved.

The splitter 130 may receive the first and second delay locked clocks CK and QCK and generate four-phase clocks ICLK, QCLK, ICLKB, and QCLKB. However, the four-phase clocks ICLK, QCLK, ICLKB, and QCLKB may have phase offsets from each other. The phase offset between the first and second divided clocks ICLK/ICLKB and the third and fourth divided clocks QCLK/QCLKB may occur due to duty distortion of the external differential clocks CLK/CLKB. Furthermore, the phase offset between the first and second divided clocks ICLK and ICLKB and the phase offset between the third and fourth divided clocks QCLK and QCLKB may occur due to duty distortion occurring in the delay line unit 121 and a phase offset occurring in a delay line within the splitter 130. The phase correction unit 140 may remove such offsets and generate final delay locked clocks ICLK_DLL, ICLKB_DLL, QCLK_DLL, and QCLKB_DLL having precise phase relationships relative to each other.

The phase correction unit 140 includes a delay block 141, a driver 142, a multi-phase detection unit 143, and a phase delay control unit 144.

The delay block 141 may include one fixed delay unit 141_1 and three variable delay units 141_2, 141_3 and 141_4. The second divided clock ICLKB, the third divided clock QCLK and the fourth divided clock QCLKB, excluding the first divided clock ICKL, may be delayed through the variable delay units 141_2, 141_3, and 141_4, respectively, and then outputted as clocks having a predetermined phase difference from each other.

The driver 142 may drive the clocks outputted through the delay block 141, and output first and second final delay locked clocks ICLK_DLL/ICLKB_DLL and third and fourth final delay locked clocks QCLK_DLL/QCLKB_DLL. The phases of the first and second final delay locked clocks ICLK_DLL/ICLKB_DLL and the third and fourth final delay locked clocks QCLK_DLL/QCLKB_DLL may be detected through the multi-phase detection unit 143, and a phase error between the respective final delay locked clocks ICLK_DLL, ICLKB_DLL, QCLK_DLL, and QCLKB_DLL may be reduced in response to the second delay control signal CTRL2 outputted through the phase delay control unit 144.

However, each of the variable delay units 141_2, 141_3, and 141_4 included in the delay block 141 inevitably generates a one-bit offset due to the characteristics of digital control. In the conventional DLL circuit shown in FIG. 1, a three-bit offset may be generated as the maximum offset.

SUMMARY

Various embodiments are directed to a delay locked loop (DLL) circuit including a single-to-differential divider capable of generating multi-phase divided clocks between which a phase offset is reduced.

In an embodiment, a DLL circuit may include: a DLL unit suitable for generating an internal clock by delaying an external clock by a delay amount required for locking; a single-to-differential divider suitable for generating multi-phase divided clocks at a specific edge of the internal clock; and a phase correction unit suitable for correcting a phase error between the multi-phase divided clocks.

The single-to-differential divider may include first and second flip-flops which operate in synchronization with the internal clock, and the first flip-flop has an input terminal to receive a signal which is obtained by inverting a signal of an output terminal of the first flip-flop, and the second flip-flop has an input terminal to receive a signal which is obtained by inverting the signal of the output terminal of the first flip-flop twice.

The signals of the output terminals of the first and second flip-flops may have the same delay amount based on a rising edge of the internal clock.

The DLL unit may include: a delay line unit suitable for generating the internal clock by delaying the external clock by the delay amount according to a first delay control signal; a replica delay unit suitable for generating a feedback clock by delaying the internal clock by a delay amount corresponding to an internal path; a phase comparison unit suitable for comparing a phase of the feedback clock to a phase of the external clock; and a delay control unit suitable for generating the first delay control signal according to a comparison result outputted from the phase comparison unit.

The phase correction unit may include: a plurality of delay units suitable for adjusting the phase error between the multi-phase divided clocks based on a second delay control signal; a multi-phase detection unit suitable for detecting a phase difference by comparing the phases of the multi-phase divided clocks outputted through the delay units; and a phase delay control unit suitable for generating the second delay control signal according to an output result of the multi-phase detection unit.

In an embodiment, a DLL circuit may include: a DLL unit suitable for generating first and second delayed clocks by delaying external differential clocks by a delay amount required for locking; a single-to-differential divider suitable for outputting multi-phase divided clocks at specific edges of the first and second delayed clocks, respectively; and a phase correction unit suitable for correcting a phase error between the multi-phase divided clocks.

The single-to-differential divider may include: a first single-to-differential dividing unit suitable for generating first and second divided clocks based on a rising edge of the first delayed clock, using the first delayed clock as a source clock; and a second single-to-differential dividing unit suitable for generating third and fourth divided clocks based on a rising edge of the second delayed clock, using the second delayed clock as a source clock.

Each of the first and second single-to-differential dividing units may include first and second flip-flops which operate in synchronization with the corresponding delayed clocks, and the first flip-flop has an input terminal to receive a signal which is obtained by inverting a signal of an output terminal of the first flip-flop, and the second flip-flop has an input terminal to receive a signal which is obtained by inverting the signal of the output terminal of the first flip-flop twice.

The signals of the output terminals of the first and second flip-flops may have the same delay amount based on a rising edge of the corresponding delayed clock.

The DLL unit may include: a delay line unit suitable for generating the first and second delayed clocks by delaying the external differential clocks by the delay amount according to a first delay control signal; a replica delay unit suitable for generating a feedback clock by delaying the first delayed clock by a delay amount corresponding to an internal path; a phase comparison unit suitable for comparing a phase of the feedback clock to a phase of the external clock of the external differential clocks; and a delay control unit suitable for generating the first delay control signal according to a comparison result outputted from the phase comparison unit.

The phase correction unit may include: a delay block suitable for adjusting the phase error between the multi-phase divided clocks according to a second delay control signal; a multi-phase detection unit suitable for detecting a phase difference by comparing the phases of the multi-phase divided clocks outputted through the delay units; and a phase delay control unit suitable for generating the second delay control sign according to an output result of the multi-phase detection unit.

The delay block may include: first and second fixed delay units suitable for locking the first and second divided clocks, respectively; and first and second variable delay units suitable for variably delaying the third and fourth divided clocks, respectively, based on the second delay control signal.

In an embodiment, an integrated circuit may include: a single-to-differential divider suitable for generating multi-phase divided clocks based on a specific edge of first and second clocks; and a phase correction unit suitable for correcting a phase error between the multi-phase divided clocks by adjusting delays of the multi-phase divided clocks based on a delay control signal.

The single-to-differential divider may include: a first single-to-differential dividing unit suitable for generating first and second divided clocks based on a rising edge of the first clock, using the first clock as a source clock; and a second single-to-differential dividing unit suitable for generating third and fourth divided clocks based on a rising edge of the second clock, using the second clock as a source clock.

Each of the first and second single-to-differential dividing units may include first and second flip-flops which operate in synchronization with the corresponding clock, and the first flip-flop has an input terminal to receive a signal which is obtained by inverting a signal of an output terminal of the first flip-flop, and the second flip-flop has an input terminal to receive a signal which is obtained by inverting the signal of the output terminal of the first flip-flop twice.

The signals of the output terminals of the first and second flip-flops may have the same delay amount based on a rising edge of the corresponding clock.

The first and second clocks may have a differential relationship.

The phase correction unit may include: a delay block suitable for adjusting delays of the multi-phase divided clocks based on the delay control signal; a multi-phase detection unit suitable for detecting a phase difference by comparing the phases of the multi-phase divided clocks outputted through the delay units; and a phase delay control unit suitable for generating the delay control signal according to an output result of the multi-phase detection unit.

The delay block may include: first and second fixed delay units suitable for locking the first and second divided clocks, respectively; and first and second variable delay units suitable for variably delaying the third and fourth divided clocks, respectively, based on the delay control signal.

The first and second clocks may be delay locked through a DLL unit.

DETAILED DESCRIPTION

Figure 1:
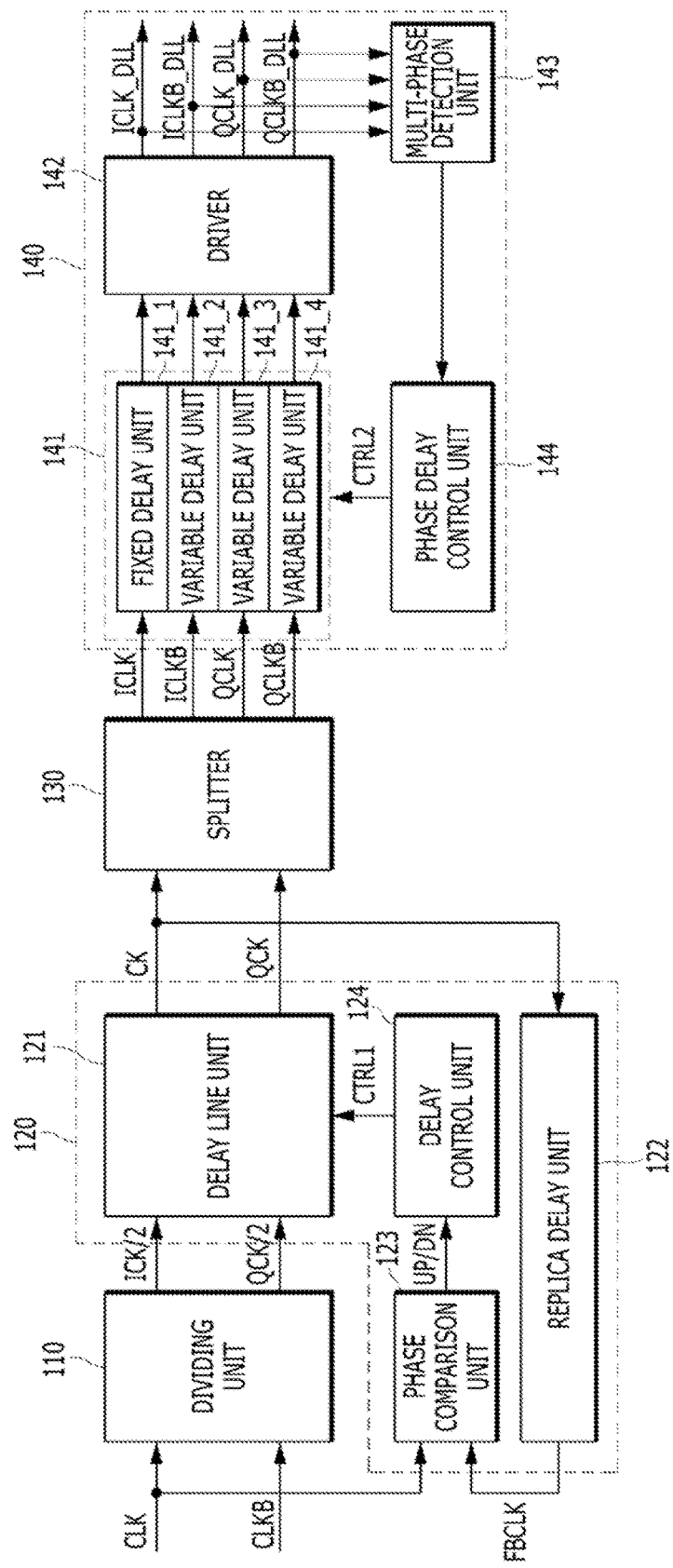
FIG. 1 is a diagram illustrating a conventional DLL circuit.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention.

The drawings are not necessarily to scale and, in some instances, proportions may have been exaggerated to clearly illustrate features of the embodiments. It is also noted that in this specification, "connected/coupled" refers to one component not only directly coupling another component, but also indirectly coupling another component through an intermediate component. In addition, a singular form may include a plural form as long as it is not specifically mentioned.

Figure 2:
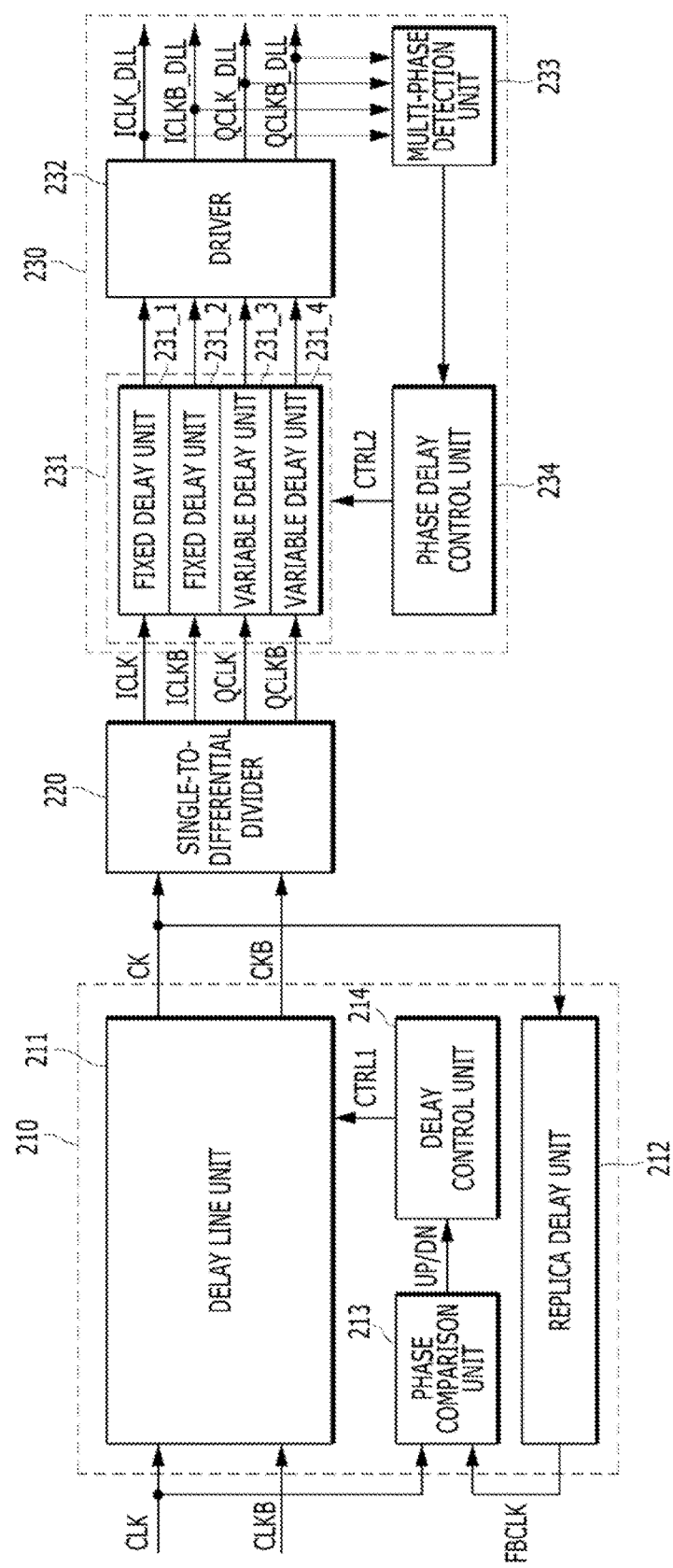
FIG. 2 is a diagram illustrating a DLL circuit in accordance with an embodiment of the present invention.

FIG. 2 is a diagram illustrating a delay locked loop (DLL) circuit in accordance with an embodiment of the present invention.

Referring to FIG. 2, the DLL circuit may include a delay locked loop (DLL) unit 210, a single-to-differential divider 220, and a phase correction unit 230.

The DLL unit 210 may include a delay line unit 211, a replica delay unit 212, a phase comparison unit 213, and a delay control unit 214.

The delay line unit 211 may output first and second delayed clocks CK/CKB by delaying external differential clocks CLK/CLKB in response to a first delay control signal CTRL1.

The replica delay unit 212 may include a block obtained by modeling delay elements through which the external clock CLK of the external differential clocks CLK/CLKB passes and delay elements through which the first delayed clock CK outputted from the delay line unit 221 passes. The replica delay unit 212 may reflect an actual delay component of a clock and data path into the first delayed clock CK outputted from the delay line unit 211, and output a feedback clock FBCLK.

The phase comparison unit 213 may compare a phase of the external clock CLK to a phase of he feedback clock FBCLK, and detect a phase difference between the two clocks.

The delay control unit 214 may generate the first delay control signal CTRL1 having information on a delay amount, according to the comparison result UP/DN outputted from the phase comparison unit 213.

The single-to-differential divider 220 may receive the first and second delayed clocks CK and CKB, and generate four-phase clocks ICLK, QCLK, ICLKB, and QCLKB. The single-to-differential divider 220 may generate two divided clocks corresponding to each of the first and second delayed clocks CK/CKB. That is, the single-to-differential divider 220 may generate the first and second divided clocks ICLK/ICLKB based on the first delayed clock CK, and generate the third and fourth divided clocks QCLK/QCLKB based on the second delayed clock CKB.

The phase correction unit 230 may include a delay block 231, a driver 232, a multi-phase detection unit 233, and a phase delay control unit 234.

The delay block 231 may include two fixed delay units 231_1 and 231_2 and two variable delay units 231_3 and 231_4. Since the first and second divided clocks ICLK/ICLKB have the same delay amount based on a rising edge of the first delayed clock CK due to the operation characteristics of the single-to-differential divider 220, no phase offset occurs between the first and second divided clocks ICLK/ICLKB. Thus, since the phase offset between the first and second divided clocks ICKL/ICLKB does not need to be corrected, the fixed delay units 231_1 and 231_2 may be used.

Furthermore, no phase offset occurs between the third and fourth divided clocks QCLK/QCKLB. However, a phase offset may occur between the first and second divided clocks ICLK/ICLKB and the third and fourth divided clocks QCLK/QCLKB, due to duty distortion of the external differential clocks CLK/CLKB. Thus, each of the two variable delay units 231_3 and 231_4 may correct the phase offset in response to a second delay control signal CTRL2 outputted from the phase delay control unit 234.

The driver 232 may drive the clocks outputted through the delay block 231, and output first to fourth delay locked clocks ICLK_DLL, ICLKB_DLL, QCLK_DLL, and QCLKB_DLL. The phases of the first to fourth delay locked clocks ICLK_DLL, ICLKB_DLL, QCLK_DLL, and QCLKB_DLL may be detected through the multi-phase detection unit 233, and a phase error between the respective delay locked clocks ICLK_DLL, ICLKB_DLL, QCLK_DLL, and QCLKB_DLL may be reduced in response to the second delay control signal CTRL2.

In other words, the phase difference between the first and second divided clocks ICLK/ICLKB and the third and fourth divided clocks QCLK/QCLKB may be adjusted through the phase correction unit 230. Thus, the phase correction unit 230 may output the first to fourth delay locked clocks ICLK_DLL, ICLKB_DLL, QCLK_DLL, and QCLKB_DLL between which the phase error is corrected.

Figure 3:
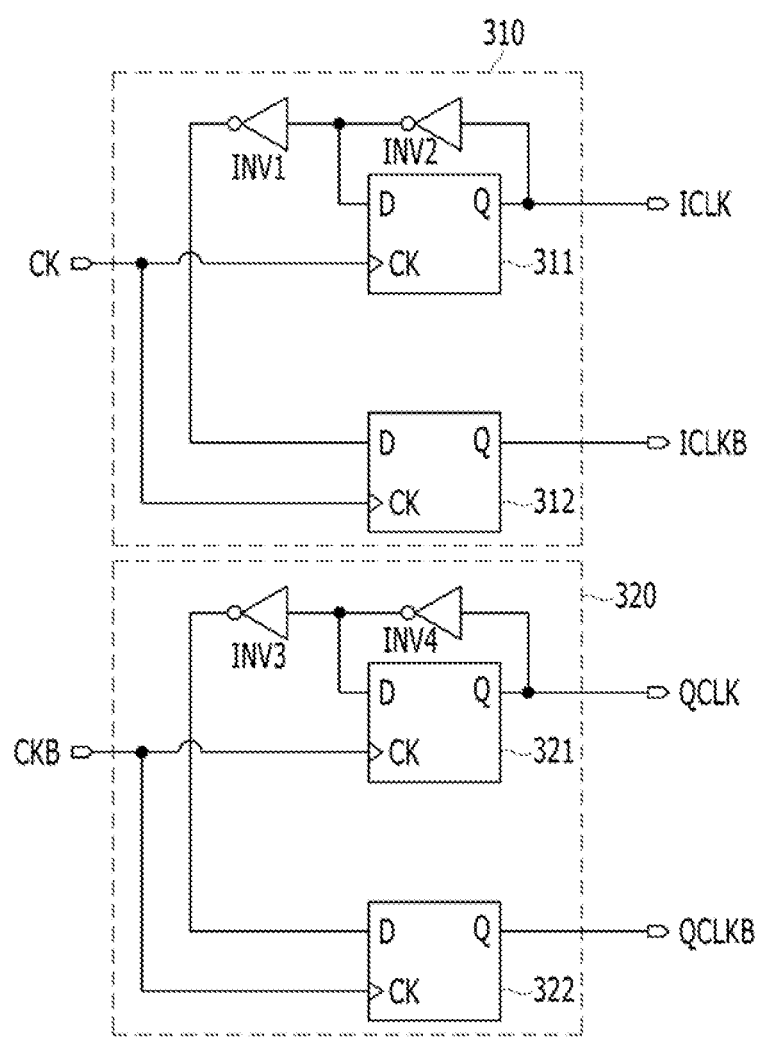
FIG. 3 is a detailed diagram of a single-to-differential divider illustrated in FIG. 2.

FIG. 3 is a detailed diagram of the single-to-differential divider illustrated in FIG. 2.

The single-to-differential divider 220 may include a first single-to-differential dividing unit 310 and a second single-to-differential dividing unit 320.

The first single-to-differential dividing unit 310 may generate the first and second divided clocks ICLK/ICLKB based on the first delayed clock CK, and the second singleto-differential dividing unit 320 may generate the third and fourth divided clocks QCLK/QCLKB based on the second delayed clock CKB.

The first and second single-to-differential dividing units 310 and 320 may be configured in the same manner.

The first single-to-differential dividing unit 310 may have first and second flip-flops 311 and 312 and first and second inverters INV1 and INV2.

The first and second flip-flops 311 and 312 may output signals of input terminals D to output terminals Q in synchronization with the first delayed clock CK, and thus output the first and second divided clocks ICLK/ICLKB. The signal inputted to the input terminal D of the first flip-flop 311, between the first and second flip-flops 311 and 312, may be obtained by inverting the signal of the output terminal Q of the first flip-flip 311 through the second inverter INV2, and the signal inputted to the input terminal D of the second flip-flop 312 may be obtained by inverting the signal of the output terminal Q of the first flip-flop 311 through the first and second inverters INV1 and INV2.

The first and second single-to-differential dividing units 310 and 320 may be configured in the same manner. That is, the second single-to-differential dividing unit 320 may have two flip-flops 321 and 322 and two inverters INV3 and INV4.

Thus, since the first and second divided clocks ICLK/ICLKB have a differential relationship therebetween and have the same delay based on a rising edge of the first delayed clock CK, no phase offset occurs therebetween. Similarly, no phase offset occurs between the third and fourth divided clocks QCLK/QCKLB.

Figure 4:
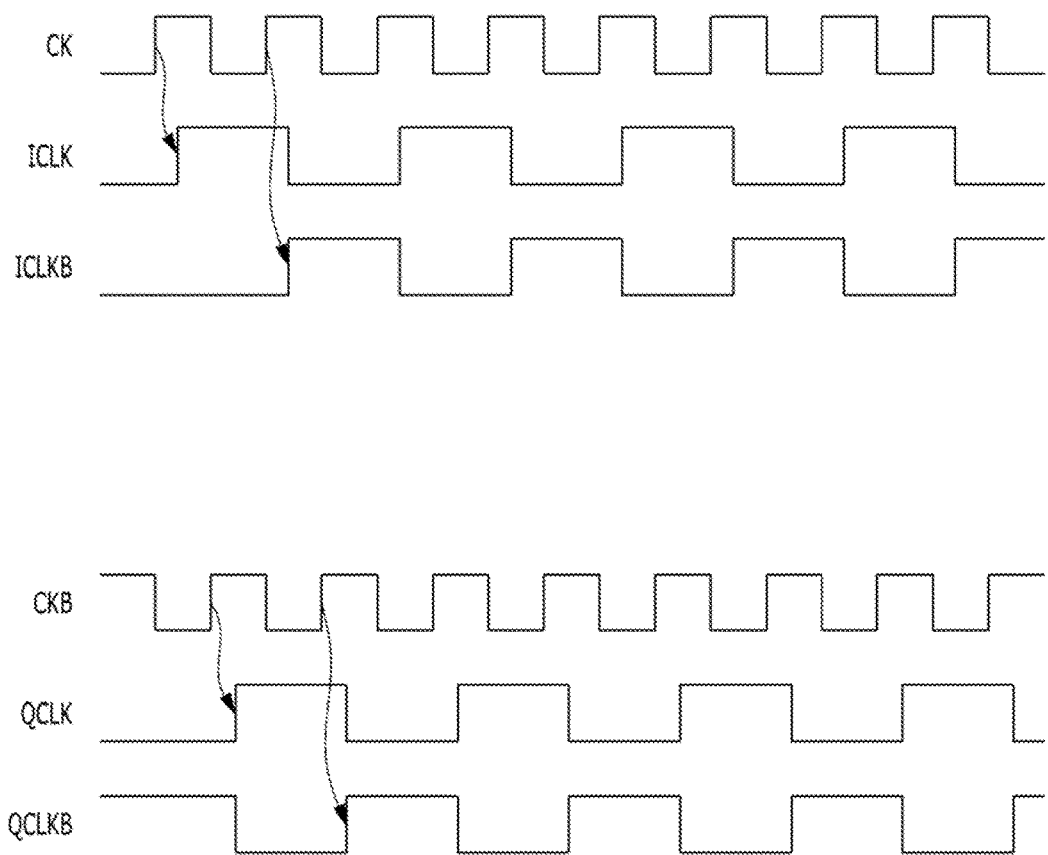
FIG. 4 is a timing diagram for describing an operation of the single-to-differential divider shown in FIG. 3.

FIG. 4 is a timing diagram for describing an operation of the single-to-differential divider shown in FIG. 3.

Referring to FIGS. 3 and 4, the first single-to-differential divider 310 of the single-to-differential divider 220 may receive an inverted signal and a delayed signal of the signal of the output terminal Q of the first flip-flop 311 as signals of the input terminals D, and output the first and second divided clocks ICKL/ICLKB in synchronization with the first delayed clock CK.

The first and second divided clocks ICLK and ICLKB may have the same delay based on a rising edge of the first delayed clock CK. Since the splitter used in the conventional DLL circuit receives one input signal and outputs two output signals through the delay lines having different delay amounts, a phase offset may occur between the output signals. However, as the single-to-differential divider 220 outputs two differential signals corresponding to the same signal through the flip-flop circuits, the two output signals may have the same delay based on a rising edge of the first delayed clock CK, for example. Thus, no phase offset occurs therebetween. Thus, the phase difference between the first and second divided clocks ICLK and ICLKB does not need to be corrected. Similarly, no phase offset occurs between the third and fourth divided clocks QCLK/QCKLB. Thus, a phase difference between the third and fourth divided clocks QCLK/QCKLB does not need to be corrected.

Figure 5:
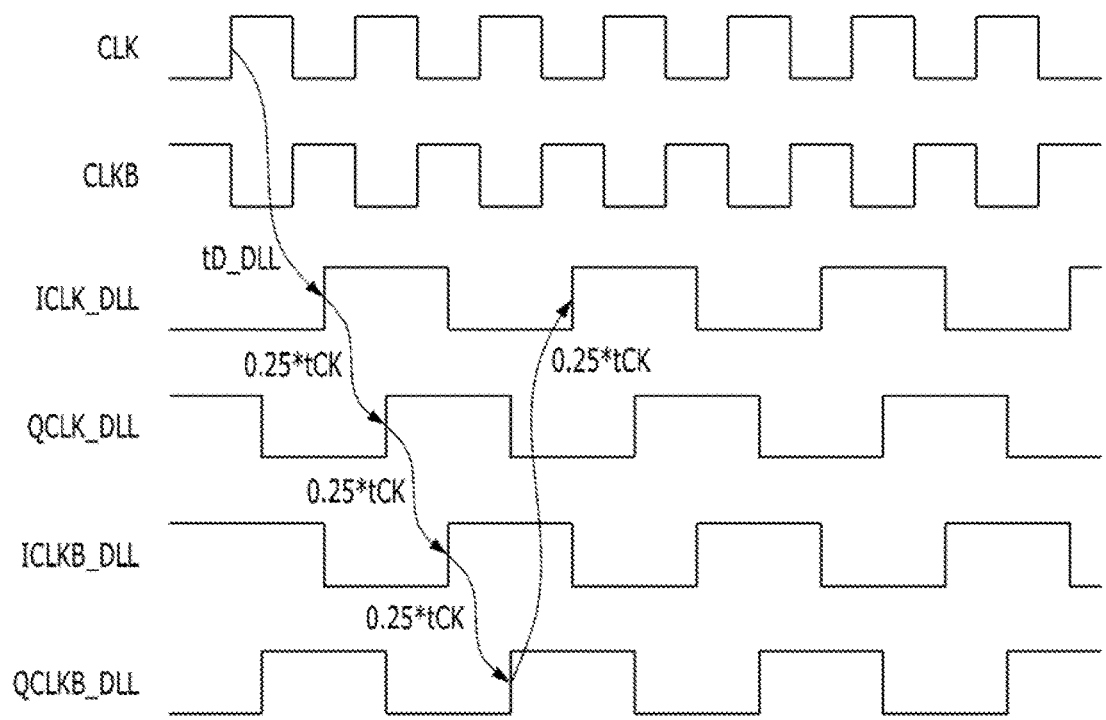
FIG. 5 is a timing diagram for describing an operation of the DLL circuit shown in FIG. 2.

FIG. 5 is a timing diagram for describing an operation of the DLL circuit shown in FIG. 2. FIG. 5 shows four-phase clocks outputted through the DLL circuit shown in FIG. 2.

Referring to FIGS. 2 to 5, phase errors of the four-phase clocks ICLK, QCLK, ICLKB, and QCLKB outputted through the single-to-differential divider 220 may be corrected through the phase correction unit 230, and the first and second delay locked clocks ICLK_DLL and ICLKB_DLL and the third and fourth delay locked clocks QCLK_DLL and QCLKB_DLL corresponding to the four-phase clocks ICLK, QCLK, ICLKB, and QCLKB may be outputted. Since the first and second delay locked clocks ICLK_DLL and ICLKB_DLL pass through the fixed delay units 231_1 and 231_2, the first and second delay locked clocks ICLK_DLL and ICLKB_DLL may not be corrected separately. The third and fourth delay locked clocks QCLK_DLL and QCLKB_DLL may be corrected through the variable delay units 231_3 and 231_4, to correct the phase offset between the first and second delay locked clocks ICLK_DLL and ICLKB_DLL and the third and fourth delay locked clocks QCLK_DLL and QCLKB_DLL.

Thus, the first delay locked clock ICLK_DLL, the third delay locked clock ICLKB_DLL, the second delay locked clock QCLK_DLL, and the fourth delay locked clock QCLKB_DLL may be outputted with a phase difference of 90 degrees (i.e. 0.5 *tCK) relative to each other.

In the conventional DLL circuit shown in FIG. 1, since the splitter 130 is used to generate four-phase divided clocks, a phase offset occurs between the first and second divided clocks ICLK and ICLKB, between the third and fourth divided clocks QCLK and QCLKB, and between the first and second divided clocks ICLK/ICLKB and the third and fourth divided clocks QCLK/QCLKB. However, in the DLL circuit in accordance with the present embodiment, the splitter 130 is replaced with the single-to-differential divider 220 to generate four-phase divided clocks. Thus, no phase difference occurs between the first and second divided clocks ICLK and ICLKB and between the third and fourth divided clocks QCLK and QCLKB. Thus, the DLL circuit may consider only the phase difference between the first and second divided clocks ICLK/ICLKB and the third and fourth divided clocks QCLK/QCLKB. That is, the DLL circuit may reduce the offset between multiple phases more effectively than the conventional DLL circuit, thereby generating more precise multi-phase clocks.

In accordance with the embodiments of the present invention, the DLL circuit may generate multi-phase clocks through the single-to-differential divider and reduce the phase offset between the multi-phase clocks, thereby generating more precise multi-phase clocks.

Although various embodiments have been described for illustrative purposes, it will be apparent to those skilled in the art that various changes and modifications may be made without departing from the spirit and scope of the invention as defined in the following claims.

What is claimed is:

1. A delay locked loop (DLL) circuit comprising:
   a DLL unit suitable for generating an internal clock by delaying an external clock by a delay amount required for locking;
   a single-to-differential divider suitable for generating multi-phase divided clocks at a specific edge of the internal clock; and
   a phase correction unit suitable for correcting a phase error between the multi-phase divided clocks,
   wherein the single-to-differential divider comprises first and second flip-flops which operate in synchronization with the internal clock,
   wherein the first flip-flop has an input terminal to receive a signal which is obtained by inverting a signal of an output terminal of the first flip-flop, and the second flip-flop has an input terminal to receive a signal which is obtained by inverting the signal of the output terminal of the first flip-flop twice.

2. The DLL circuit of claim 1, wherein the signals of the output terminals of the first and second flip-flops have the same delay amount based on a rising edge of the internal clock.

3. The DLL circuit of claim 1, wherein the DLL unit comprises:
   a delay line unit suitable for generating the internal clock by delaying the external clock by the delay amount according to a first delay control signal;
   a replica delay unit suitable for generating a feedback clock by delaying the internal clock by a delay amount corresponding to an internal path;
   a phase comparison unit suitable for comparing a phase of the feedback clock to a phase of the external clock; and
   a delay control unit suitable for generating the first delay control signal according to a comparison result outputted from the phase comparison unit.

4. The DLL circuit of claim 1, wherein the phase correction unit comprises:
   a plurality of delay units suitable for adjusting the phase error between the multi-phase divided clocks based on a second delay control signal;
   a multi-phase detection unit suitable for detecting a phase difference by comparing the phases of the multi-phase divided clocks outputted through the delay units; and
   a phase delay control unit suitable for generating the second delay control signal according to an output result of the multi-phase detection unit.

5. A DLL circuit comprising:
   a DLL unit suitable for generating first and second delayed clocks by delaying external differential clocks by a delay amount required for locking;
   a single-to-differential divider suitable for outputting multi-phase divided clocks at specific edges of the first and second delayed clocks, respectively; and
   a phase correction unit suitable for correcting a phase error between the multi-phase divided clocks,
   wherein the single-to-differential divider comprises:
   a first single-to-differential dividing unit suitable for generating first and second divided clocks based on a rising edge of the first delayed clock, using the first delayed clock as a source clock; and
   a second single-to-differential dividing unit suitable for generating third and fourth divided clocks based on a rising edge of the second delayed clock, using the second delayed clock as a source clock, and
   wherein each of the first and second single-to-differential dividing units comprises first and second flip-flops which operate in synchronization with the corresponding delayed clocks.

6. The DLL circuit of claim 5, wherein the first flip-flop has an input terminal to receive a signal which is obtained by inverting a signal of an output terminal of the first flip-flop, and the second flip-flop has an input terminal to receive a signal which is obtained by inverting the signal of the output terminal of the first flip-flop twice.

7. The DLL circuit of claim 6, wherein the signals of the output terminals of the first and second flip-flops have the same delay amount based on a rising edge of the corresponding delayed clock.

8. The DLL circuit of claim 5, wherein the DLL unit comprises:
   a delay line unit suitable for generating the first and second delayed clocks by delaying the external differential clocks by the delay amount according to a first delay control signal;
   a replica delay unit suitable for generating a feedback clock by delaying the first delayed clock by a delay amount corresponding to an internal path;
   a phase comparison unit suitable for comparing a phase of the feedback clock to a phase of the external clock of the external differential clocks; and
   a delay control unit suitable for generating the first delay control signal according to a comparison result outputted from the phase comparison unit.

9. The DLL circuit of claim 5, wherein the phase correction unit comprises:
   a delay block suitable for adjusting the phase error between the multi-phase divided clocks according to a second delay control signal;
   a multi-phase detection unit suitable for detecting a phase difference by comparing the phases of the multi-phase divided clocks outputted through the delay units; and
   a phase delay control unit suitable for generating the second delay control signal according to an output result of the multi-phase detection unit.

10. The DLL circuit of claim 9, wherein the delay block comprises:
    first and second fixed delay units suitable for locking the first and second divided clocks, respectively; and
    first and second variable delay units suitable for variably delaying the third and fourth divided clocks, respectively, based on the second delay control signal.

11. An integrated circuit comprising:
    a single-to-differential divider suitable for generating multi-phase divided clocks based on a specific edge of first and second clocks; and
    a phase correction unit suitable for correcting a phase error between the multi-phase divided clocks by adjusting delays of the multi-phase divided clocks based on a delay control signal,
    wherein the single-to-differential divider comprises:
    a first single-to-differential dividing unit suitable for generating first and second divided clocks based on a rising edge of the first clock, using the first clock as a source clock; and
    a second single-to-differential dividing unit suitable for generating third and fourth divided clocks based on a rising edge of the second clock, using the second clock as a source clock, and
    wherein each of the first and second single-to-differential dividing units comprises first and second flip-flops which operate in synchronization with the corresponding clock.

12. The integrated circuit of claim 11, wherein the first flip-flop has an input terminal to receive a signal which is obtained by inverting a signal of an output terminal of the first flip-flop, and the second flip-flop has an input terminal to receive a signal which is obtained by inverting the signal of the output terminal of the first flip-flop twice.

13. The integrated circuit of claim 12, wherein the signals of the output terminals of the first and second flip-flops have the same delay amount based on a rising edge of the corresponding clock.

14. The integrated circuit of claim 11, wherein the first and second clocks have a differential relationship.

15. The integrated circuit of claim 11, wherein the phase correction unit comprises:
    a delay block suitable for adjusting delays of the multi-phase divided clocks based on the delay control signal;
    a multi-phase detection unit suitable for detecting a phase difference by comparing the phases of the multi-phase divided clocks outputted through the delay units; and a phase delay control unit suitable for generating the delay control signal according to an output result of the multi-phase detection unit.

16. The integrated circuit of claim 15, wherein the delay block comprises:
   first and second fixed delay units suitable for locking the first and second divided clocks, respectively; and
   first and second variable delay units suitable for variably delaying the third and fourth divided clocks, respectively, based on the delay control signal.

17. The integrated circuit of claim 11, wherein the first and second clocks are delay locked through a DLL unit.

* * * * *